(12) United States Patent
Kobayashi et al.

(10) Patent No.: US 7,227,214 B2
(45) Date of Patent: Jun. 5, 2007

(54) SEMICONDUCTOR DEVICE AND METHOD OF MANUFACTURING THE SAME

(75) Inventors: Osamu Kobayashi, Kawasaki (JP); Akiyoshi Watanabe, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/112,701

(22) Filed: Apr. 2, 2002

(65) Prior Publication Data

US 2003/0062564 A1 Apr. 3, 2003

(30) Foreign Application Priority Data

Oct. 3, 2001 (JP) .............................. 2001-307784

(51) Int. Cl.
*H01L 27/108* (2006.01)
*H01L 29/94* (2006.01)

(52) U.S. Cl. ............................ 257/306; 257/E27.025; 257/308; 257/532; 257/630; 257/758; 438/393; 438/396

(58) Field of Classification Search ................ 257/700, 257/532, 533, 528, 379, 303, 306–309, 530, 257/630, 340, E27.016–E27.026, 758, 620, 257/629, 339, 298, 393, 394, 488–490, 409; 438/393, 396, 622

See application file for complete search history.

(56) References Cited

U.S. PATENT DOCUMENTS

| | | | | |
|---|---|---|---|---|
| 5,604,658 A | * | 2/1997 | Pedder | 361/277 |
| 5,841,190 A | * | 11/1998 | Noda et al. | 257/678 |
| 5,874,770 A | * | 2/1999 | Saia et al. | 257/536 |
| 6,072,278 A | * | 6/2000 | Keyser et al. | 315/169.1 |
| 6,130,463 A | * | 10/2000 | Oda et al. | 257/384 |
| 6,180,976 B1 | * | 1/2001 | Roy | 257/306 |
| 6,198,123 B1 | * | 3/2001 | Linder et al. | 257/306 |
| 6,392,297 B2 | * | 5/2002 | Seto | 257/701 |
| 6,545,926 B2 | * | 4/2003 | Ooishi et al. | 365/225.7 |
| 6,630,736 B1 | * | 10/2003 | Ignaut | 257/737 |

FOREIGN PATENT DOCUMENTS

| JP | 03201417 A | * | 9/1991 |
|---|---|---|---|
| JP | 2001-267320 A | | 9/2001 |

OTHER PUBLICATIONS

Japanese Office Action, Mailed Apr. 19, 2005.

* cited by examiner

*Primary Examiner*—Kenneth Parker
*Assistant Examiner*—Chris C. Chu
(74) *Attorney, Agent, or Firm*—Westerman, Hattori, Daniels & Adrian, LLP.

(57) ABSTRACT

A lower electrode of a capacitor element and a wiring are formed in a wiring layer that is one layer below an uppermost wiring layer. Subsequently, after the formation of a capacitance insulating film, a TiN film is formed on the entire surface thereof, and then the TiN film is patterned, thereby forming an upper electrode of a capacitor element and a lead wiring for electrically connecting the upper electrode to a wiring of a third wiring layer. Furthermore, in the uppermost layer, a shield is formed covering the upper portion of the capacitor element.

5 Claims, 18 Drawing Sheets

SEMICONDUCTOR DEVICE AND METHOD OF MANUFACTURING THE SAME

CROSS-REFERENCE TO RELATED APPLICATIONS

This application is based upon and claims priority of Japanese Patent Applications No.2001-307784, filed in Oct. 3, 2001, the contents being incorporated herein by reference.

BACKGROUND OF THE INVENTION

1. Field of the Invention

The present invention relates to a semiconductor device having a MIM (Metal Insulator Metal) capacitor element suitable for an analog circuit and a method of manufacturing the same.

2. Description of the Prior Art

C-MOS type semiconductor devices (integrated circuit), in which a capacitor element used for an analog circuit is formed on a semiconductor substrate, have been developed. Among these semiconductor devices, each of which has a S/H (Sample/Hold) circuit connected to a D/A (digital/analog) converter and an A/D (analog/digital) converter, are required to retain charges in the capacitor element precisely.

FIG. 1 is a circuit diagram showing an example of the S/H circuit. The S/H circuit comprises a switching element 2, a capacitor element 3 and a buffer circuit 4. In addition, an input terminal 1 receives an analog signal, and an A/D converter (not shown) is connected to an output terminal 5.

The switching element 2 receives a clock signal, and the switching element 2 is rendered to be ON when the clock signal is high (H) in level, thus charging the capacitor element 3 with charges in accordance with a voltage of the analog signal. When the clock signal becomes low (L) in level, the switching element 2 is rendered to be OFF. Thus, the capacitor element 3 retains the charges charged therein. The buffer circuit 4 supplies to the A/D converter the voltage in accordance with the charges charged in the capacitor element 3. Thus, a digital signal in accordance with the voltage of the analog signal is output from the A/D converter.

As the capacitor element formed in the C-MOS type semiconductor device, enumerated are (1) one having the same structure as that of a MOS transistor, that is, one constituting a capacitor by a polysilicon gate and a semiconductor substrate, (2) one constituted by a pair of polysilicon films laminated on a semiconductor substrate so as to sandwich an insulating film therebetween, which is so-called a double polysilicon capacitor element, and (3) one constituted by a pair of metallic films laminated on a semiconductor substrate so as to sandwich an insulating film therebetween, which is so-called a MIM capacitor element.

Incidentally, since polysilicon offers a relatively high resistivity, use of the polysilicon for one or both of electrodes of the capacitor elements means that a resistor element is in series connected to the capacitor element. Accordingly, the capacitor element using the polysilicon is not suitable for the S/H circuit which is required to operate at a high speed. Moreover, since the polysilicon is a semiconductor, the capacitor element using the polysilicon has also a drawback that a thickness of a depletion layer changes in response to a voltage applied between the electrodes, leading to a change of a capacitance value thereof.

Contrary to this, the MIM capacitor element has an advantage that both of electrodes thereof are made of a metallic film and show low resistivity and a capacitance value does not change by a voltage applied.

FIG. 2 is a section view showing an example of a conventional semiconductor device comprising the MIM capacitor element.

Element isolation regions 11 which partition a semiconductor substrate 10 into a plurality of element regions are provided on the semiconductor substrate 10. In each of the element regions partitioned by the element isolation region 11, a pair of impurity diffusion regions 12 that are source/drain of the MOS transistor are formed in a state where they are separated from each other. A gate 13 is formed above a region between the pair of impurity diffusion regions 12 so as to interpose an insulating film (gate insulating film) therebetween.

Four wiring layers are provided above the semiconductor substrate 10. Herein, the four wiring layers indicate a first wiring layer (lowermost layer) 15, a second wiring layer 17, a third wiring layer 19 and a fourth wiring layer (uppermost layer) 23, respectively, in the order of closeness to the semiconductor substrate 10. Interlayer insulating films 25a, 25b, 25c and 25d are formed between the semiconductor substrate 10 and the first wiring layer 15, the first wiring layer 15 and the second wiring layer 17, the second wiring layer 17 and the third wiring layer 19, and the third wiring layer 19 and the fourth wiring layer 23, respectively. A predetermined pattern wiring is formed in each of the wiring layers 15, 17, 19 and 23 respectively.

In the example shown in FIG. 2, one of the impurity diffusion regions 12 of the MOS transistor is connected to a wiring 15a of the first wiring layer 15 via a via 14a, and the gate 13 is connected to a wiring 15b of the first wiring layer 15 via a via 14b. Furthermore, the wiring 15a is connected to a wiring 17a of the second wiring layer 17 via a via 16a, and the wiring 15b is connected to a wiring 17b of the second wiring layer 17 via a via 16b. Still furthermore, the wiring 17a is via a via 18a connected to a lower electrode 19a of a capacitor element 24 formed in the third wiring layer 19, and the wiring 17b is connected to the wiring 19b of the third wiring layer 19 via a via 18b.

A capacitance insulating film 20 is formed on the lower electrode 19a, and an upper electrode 21 is formed on the capacitance insulating film 20.

In the fourth wiring layer 23, formed are a shield 23a covering the upper portion of the capacitor element 24 and a lead wiring 23b connected to the upper electrode 21 and the wiring 19b respectively via the vias 22a and 22b.

A passivation film (not shown) made of polyimide or the like is formed on the fourth wiring layer 23. The semiconductor substrate 10 in which these wiring layers 15, 17, 19 and 23 and the passivation film are formed is sealed in a package (not shown) made of resin or the like.

Although the lower electrode of the MIM capacitor element is usually formed simultaneously with formation of the wiring in the wiring layer, the capacitor insulating film and the upper electrode must be formed independently from the wiring layer and the interlayer insulating film. Accordingly, if the lower electrode of the MIM capacitor element is formed by use of the wiring layer, for example, the first wiring layer, which is close to the semiconductor substrate, a large step difference (unevenness) is produced between a formation region of the MIM capacitor element and a region around the formation region, and it is difficult to form a minute wiring above the MIM capacitor element.

Therefore, as described above, the lower electrode of the MIM capacitor element is formed in the wiring layer immediately under the uppermost layer, and the shield covering above the MIM capacitor element is formed in the uppermost layer. In this case, though it becomes difficult to form a micro pattern in the uppermost layer, a demand for the micro pattern in the uppermost layer is generally not strict, and hence it is allowed in many cases.

The inventors of this application consider that the foregoing conventional semiconductor device has the problems described below. Specifically, though the shield 23a is formed above the MIM capacitor element in the foregoing conventional semiconductor device, the lead wiring 23b connecting the upper electrode 21 and the MOS transistor (gate 13) electrically is formed in the fourth wiring layer (uppermost layer) 23. Accordingly, parasitic capacitance is generated between the upper electrode 21 and a conductor outside the package. Then, when the package is being touched or when a radiator is being attached thereto, the value of the parasitic capacitance increases.

For example, when the capacitance insulating film is 50 nm thick, the package is made of plastic and is 0.5 mm thick, the dielectric constant of the capacitance insulating film and the plastic of the package is equivalent, there is no shield on top of the capacitor element, and a conductor of a radiator or the like is placed on the package, then the size of the parasitic capacitance becomes about 1/10000 compared to the value of the MIM capacitor element. This indicates a possibility that about 1/10000 of an external signal of the package is being induced as noises to the signal wiring. If the amplitude of the external signal of the package is equivalent to the amplitude of an internal signal, then the accuracy of the circuit deteriorates to about 13 bit ($2^{13}$=8192).

Signals in a digital audio of a CD (compact disk), etc. are being processed at a accuracy of 16 bits or more at present. Hence, a capacitor element having the above-mentioned accuracy (an accuracy in which parasitic capacitance becomes about 1/10000 to the capacity of the original MIM capacitor element) is insufficient, and therefore a capacitor element having higher accuracy is in demand.

SUMMARY OF THE INVENTION

An object of the present invention is to provide a semiconductor device having a capacitor element suitable for an analog circuit and in which the degree of being influenced by external noises is decreased compared to the past, and a method of manufacturing the same.

A semiconductor device as claimed in claim 1, which comprises a semiconductor substrate, an Nth number of metallic wiring layers (provided that N is an integer equal to or greater than 3) laminated on the semiconductor substrate with an interlayer insulating film interposed therebetween, and a capacitor element composed of a lower electrode, a capacitance insulating film, and an upper electrode formed on the semiconductor substrate, wherein the lower electrode of the capacitor element is formed in a wiring layer ((Nth−1) wiring layer) immediately under an uppermost wiring layer (Nth wiring layer), the capacitance insulating film and the upper electrode are formed between the (Nth−1) wiring layer and the Nth wiring layer, and the upper electrode is in electrical connection with a wiring of the (Nth−1) wiring layer without the Nth wiring layer interposed therebetween.

In the present invention, the lower electrode of the capacitor element is formed in the (Nth−1) wiring layer. Therefore the upper electrode of the capacitor element is in electrical connection with the wiring of the (Nth−1) wiring layer without the Nth wiring layer (uppermost layer) interposed therebetween. For this reason, for example, the shield is formed in the Nth wiring layer so as to cover the upper portion of the capacitor element. The shield is retained at a fixed voltage, whereby the generation of parasitic capacitance between the electrode of the capacitor element and an external conductor is avoided. As a result, a capacitor element suitable for an analog circuit can be attained and not influenced by external noises easily.

As claimed in claim 8, the lower electrode of the capacitor element is formed simultaneously with the formation of a wiring of the (Nth−1) wiring layer. After forming the capacitance insulating film on the lower electrode, formed are the upper electrode of the capacitor element and a lead wiring for electrically connecting the wiring of the (Nth−1) wiring layer to the upper electrode, both from a metallic material. The semiconductor device of the present invention can thus be fabricated.

There is provided a semiconductor device as claimed in claim 4 characterized in that it comprises a semiconductor substrate, an Nth number (provided that N is an integer equal to or greater than 3) of metallic wiring layers laminated on the semiconductor substrate with an interlayer insulating film interposed therebetween, and among the metallic wiring layers, a capacitor element composed of a lower electrode, a capacitance insulating film, and an upper electrode is formed between an uppermost wiring layer (Nth wiring layer) thereof and a wiring layer ((Nth−1) wiring layer) immediately under the uppermost wiring layer (Nth wiring layer), wherein the lower electrode is formed on a wiring of the (Nth−1) wiring layer, the capacitance insulating film is formed on the lower electrode, the upper electrode is formed on the capacitance insulating film, and the upper electrode is in electrical connection with the wiring of the (Nth−1) wiring layer without the Nth wiring layer interposed therebetween.

When copper is used as the wiring material, there is a limit placed on the width of a pattern to be formed in the wiring layers, and thus the formation of a large pattern is restricted. In this case, the lower electrode of the capacitor element is formed on the wiring of the (Nth−1) wiring layer, and then capacitance insulating film and the upper electrode are successively formed on the lower electrode thereof. Further, the upper electrode is connected to the wiring of the (Nth−1) wiring layer without the Nth wiring layer (uppermost layer) interposed therebetween. Then, for example, a shield is formed in the Nth wiring layer so as to cover the upper portion of the capacitor element. The shield is retained at a fixed voltage, whereby the generation of parasitic capacitance between the electrode of the capacitor element and an external conductor is avoided. As a result a capacitor element suitable for an analog circuit can be attained and not easily influenced by external noises.

As claimed in claim 9, the lower electrode of the capacitor element and the first lead wiring are formed on the wiring of the (Nth−1) wiring layer from a metallic material, after which a wiring reaching the (Nth−1) wiring layer is formed on the semiconductor substrate. The capacitance insulating film is formed on the lower electrode, and a second lead wiring for electrically connecting the first lead wiring to the upper electrode is formed together with the formation of the upper electrode on the capacitance insulating film, both of which are formed form a metallic material. Accordingly, the semiconductor device of the present invention can thus be fabricated.

DESCRIPTION OF THE PREFERRED EMBODIMENTS

Embodiment of the present invention will be described hereinafter with reference to the attached drawings.

(First Embodiment)

Figure 3:
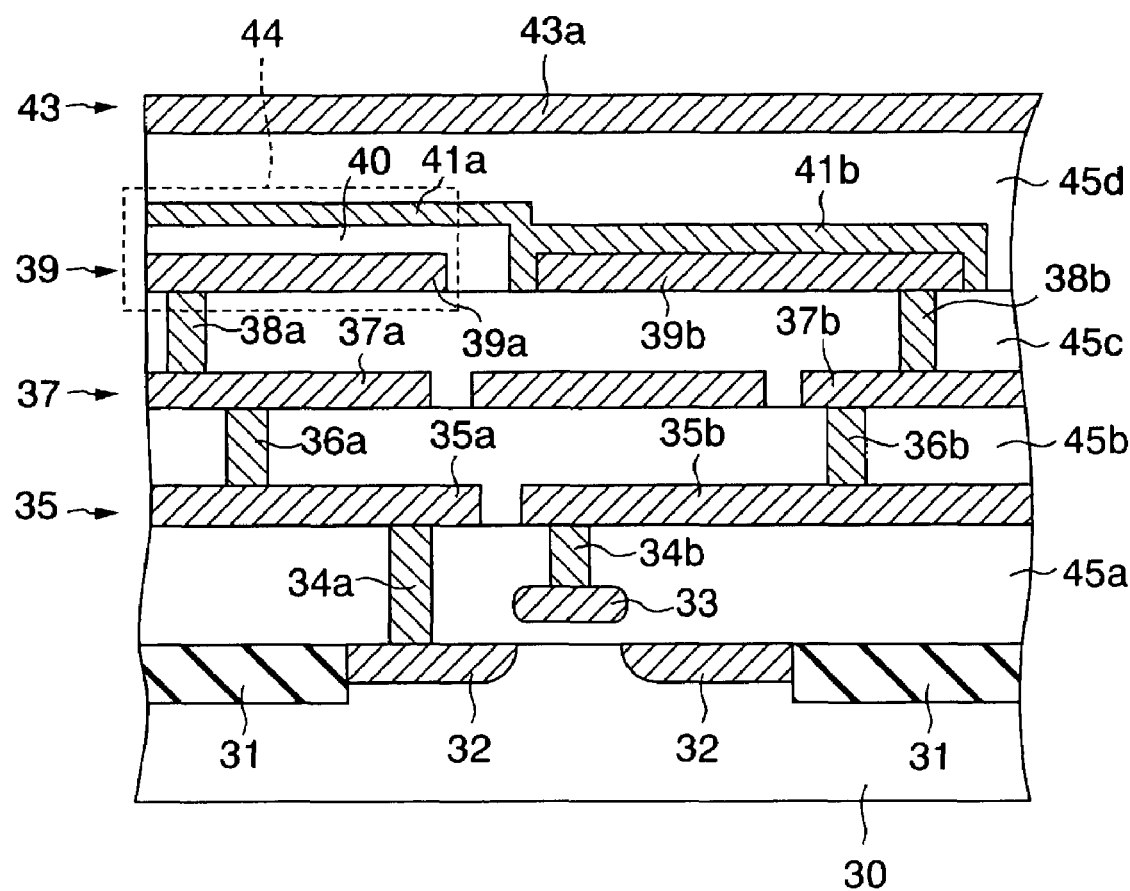
FIG. 3 is a sectional view showing a semiconductor device comprising a MIM capacitor element of a first embodiment of the present invention.

FIG. 3 is a sectional view showing a semiconductor device comprising a MIM capacitor element in accordance with Embodiment 1 of the present invention.

An element isolation region 31 which partitions a semiconductor substrate 30 into a plurality of element regions is provided in the semiconductor substrate 30. In each of the element regions partitioned by the element isolation region 31, a pair of impurity diffusion regions 32 that are source/drain of a MOS transistor are formed in a state where they are separated from each other. A gate 33 is formed on a region between the pair of impurity diffusion regions 32 so as to interpose an insulating film (gate insulating film) therebetween.

Four layers of metallic wiring layers are provided above the semiconductor substrate 30. Herein, the four metallic wiring layers indicate a first wiring layer (lowermost layer) 35, a second wiring layer 37, a third wiring layer 39, and a fourth wiring layer (uppermost layer) 43, respectively, in the order of closeness to the semiconductor substrate 30. Interlayer insulating films 45a, 45b, 45c, and 45d are formed between the semiconductor substrate 30 and the first wiring layer 35, the first wiring layer 35 and the second wiring layer 37, the second wiring layer 37 and the third wiring layer 39, and the third wiring layer 39 and the fourth wiring layer 43, respectively. A predetermined patterned wiring is formed in each of the wiring layers 35, 37, 39, and 43.

In this embodiment, one of the impurity diffusion regions 32 of the MOS transistor is connected to a wiring 35a of the first wiring layer 35 via a via 34a, and the gate 33 thereof is connected to a wiring 35b of the first wiring layer 35 via a via 34b. Further, the wiring 35a is connected to a wiring 37a of the second wiring layer 37 via a via 36a, and the wiring 35b is connected to a wiring 37b of the second wiring layer 37 via a via 36b. Still further, the wiring 37a is connected via a via 38a to a lower electrode 39a of a capacitor element 44 formed in the third wiring layer 39, and the wiring 37b is connected to a wiring 39b of the third wiring layer 39 via a via 38b.

A capacitance insulating film 40 and an upper electrode 41a are laminated on the lower electrode 39a. The upper electrode 41a is electrically connected to the wiring 39b of the third wiring layer 39 by means of a lead wiring 41b which is formed simultaneously with the upper electrode 41a.

Above the capacitor element 44, a shield 43a formed in the fourth wiring layer 43 is provided. A passivation film (not shown) made of polyimide or the like is formed on the fourth wiring layer 43. The semiconductor substrate 30, in which these wiring layers 35, 37, 39, and 43 and the passivation film are formed, is sealed in a package (not shown) made of resin or the like.

In this embodiment, the upper electrode 41a of the capacitor element 44 is connected to the wiring 39b of the third wiring layer 39 without having to go through the fourth wiring layer (uppermost layer) 43, and is thus connected to the MOS transistor via the wiring 39b. Further, in the fourth wiring layer 43, the shield 43a is formed so as to cover the upper portion of the capacitor element 44. Therefore, the shield 43a is retained at a fixed voltage, whereby the generation of parasitic capacitance between the capacitor element 44 and a conductor outside the package is avoided. Accordingly, precision of the analog circuit can be sufficiently secured.

FIGS. 4A to 4M are sectional views showing the process sequence of the manufacturing method of a semiconductor device comprising the MIM capacitor element according to the present embodiment.

Figure 4A:
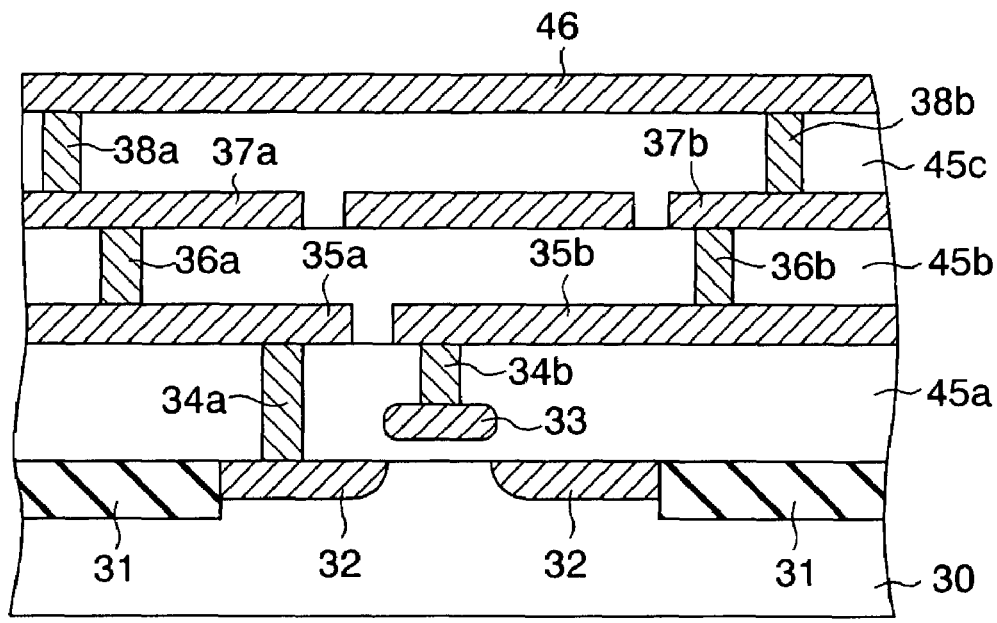
FIGS. 4A to 4M are sectional views showing a method of manufacturing of the semiconductor device comprising the MIM capacitor element of the first embodiment of the present invention.

First, as shown in FIG. 4A, an element isolation region 31 is formed in the semiconductor substrate 30 by employment of the Local Oxidation of Silicon (LOCOS) method or the Shallow Trench Isolation (STI) method. In the case of employing the STI method, for instance, a trench is formed in the semiconductor substrate 30, and thereafter silicon oxide ($SiO_2$) is filled therein, thus forming the element isolation region 31.

The insulating film (gate insulating film) is next formed on the semiconductor substrate 30 and the gate 33, which is made of polysilicon is formed with a predetermined pattern on the insulating film. After injecting an impurity into the semiconductor substrate 30 with the gate 33 as a mask, heat treatment is performed to thereby form the impurity diffusion regions 32. Silicon oxide is then deposited on the entire top surface of the semiconductor substrate 30 by means of the Chemical Vapor Deposition (CVD) method, thereby forming the interlayer insulating film 45a. A contact hole is formed at a predetermined location of the interlayer insulating film 45a by means of the photolithography method.

Next, aluminum (Al)/copper (Cu) is deposited on the entire surface of the semiconductor substrate 30 by means of the sputtering method to thereby fill up the contact hole, thus forming the via 34a and 34b and a metallic film (Al/Cu film) to a thickness of about 500 nm on the interlayer insulating film 45a as well. Then, patterning is performed on the metallic film by means of the photolithography method, thus forming the wiring 35a, 35b, etc. of the first wiring layer 35.

Silicon oxide is then deposited on the entire surface of the semiconductor substrate 30 by means of the CVD method, thereby forming the interlayer insulating film 45b, and then a contact hole is formed at a predetermined location of the interlayer insulating film 45b. Thereafter, Al/Cu is deposited on the entire top surface of the semiconductor substrate 30 by means of a sputtering method to thereby fill up the contact hole, thus forming the via 36a and 36b and a metallic film (Al/Cu film) to a thickness of about 500 nm on the interlayer insulating film 45b as well. Patterning is performed on the metallic film, thus forming the wiring 37a, 37b, etc. of the second wiring layer 37.

Subsequently, silicon oxide is deposited on the entire surface of the semiconductor substrate 30 by means of the CVD method, thereby forming the interlayer insulating film 45c, and then a contact hole is formed at a predetermined location of the interlayer insulating film 45c. Thereafter, Al/Cu is deposited on the entire surface of the semiconductor substrate 30 by means of a sputtering method to thereby fill up the contact hole, thus forming the via 38a and 38b and a metallic film (Al/Cu film) 46 to a thickness of about 500 nm on the interlayer insulating film 45c as well.

Figure 1:
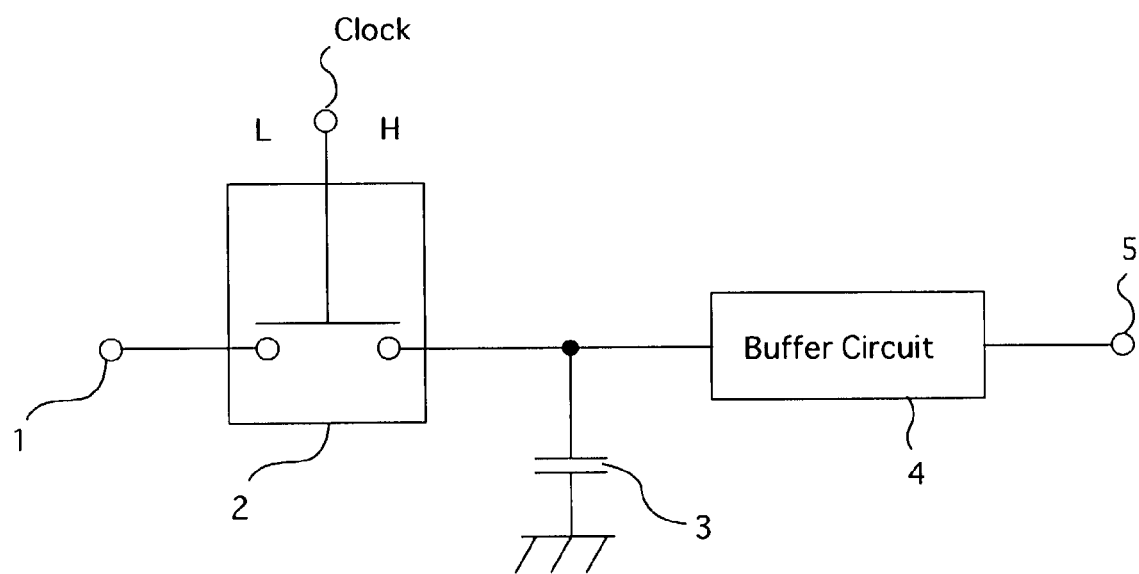
FIG. 1 is a circuit diagram showing an example of an S/H circuit.
Figure 2:
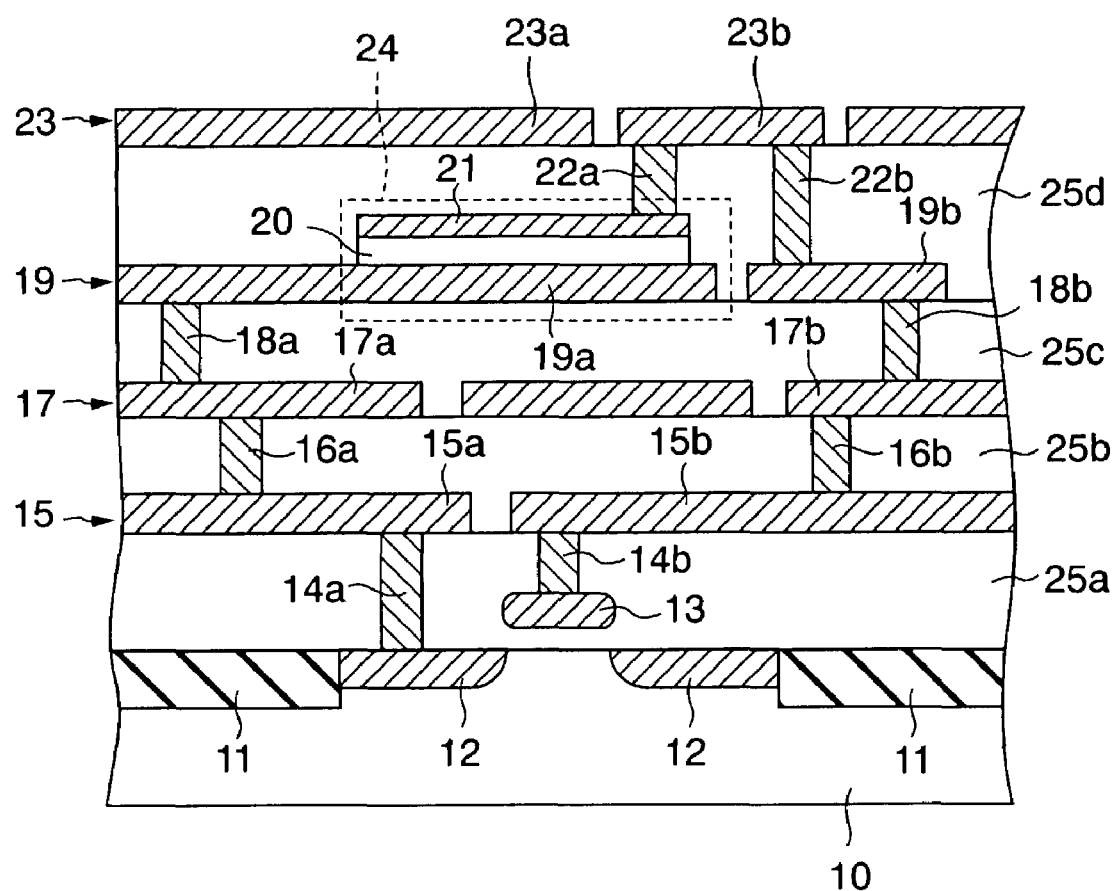
FIG. 2 is a sectional view showing an example of a conventional semiconductor device comprising a MIM capacitor element.

The processes heretofore are basically the same as the manufacturing method of the conventional semiconductor device shown in FIG. 2.

Figure 4B:
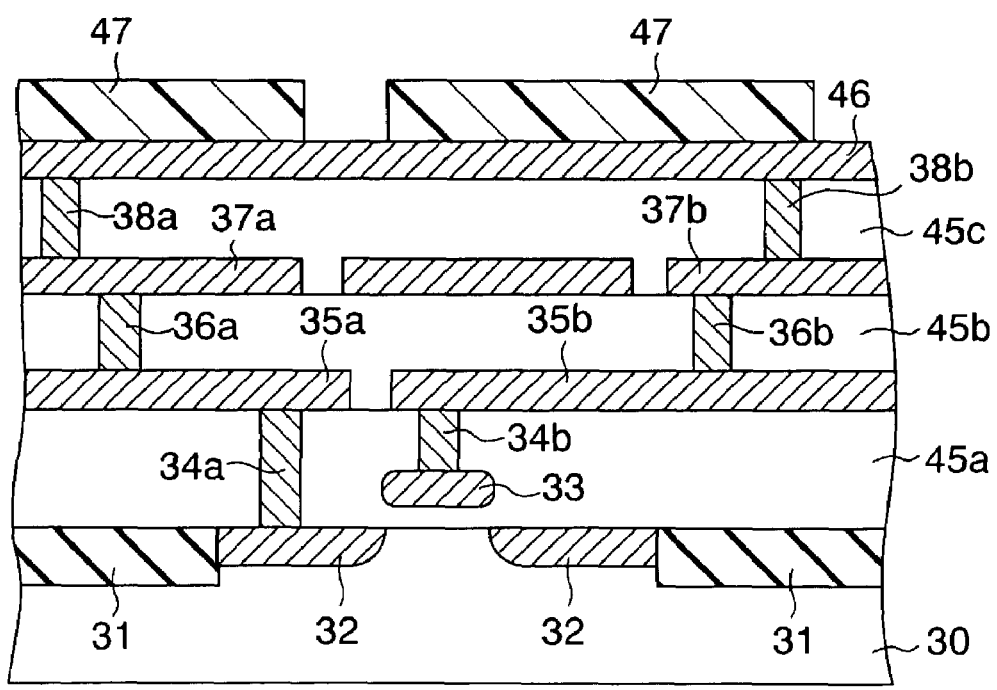

Next, a predetermined patterned resist film 47 is formed on a metallic film 46 by photoresist as shown in FIG. 4B.

Figure 4C:
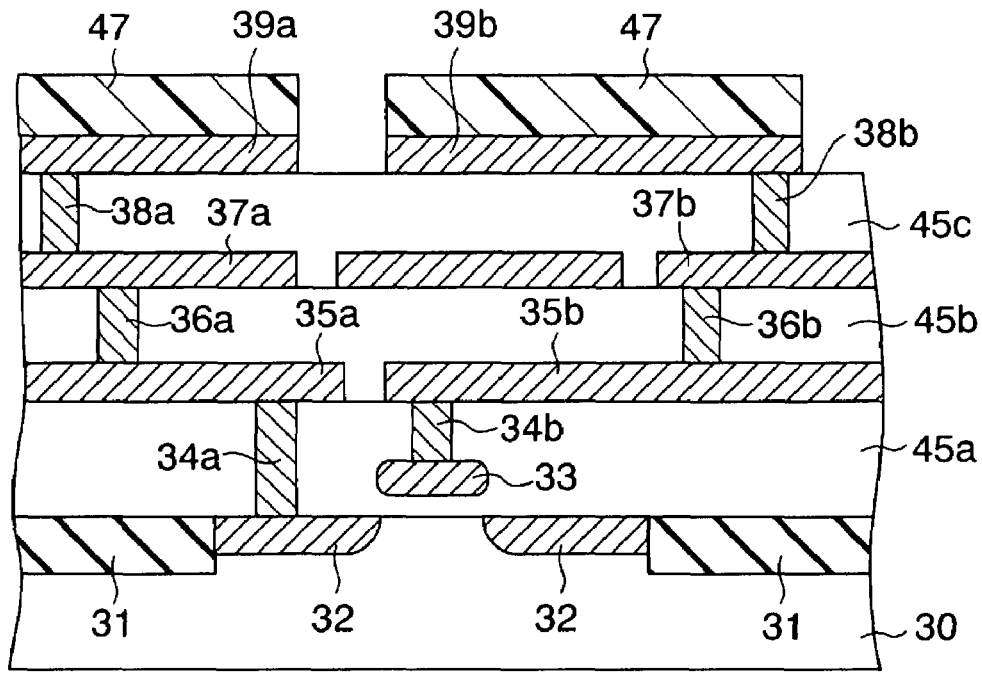
Figure 4D:
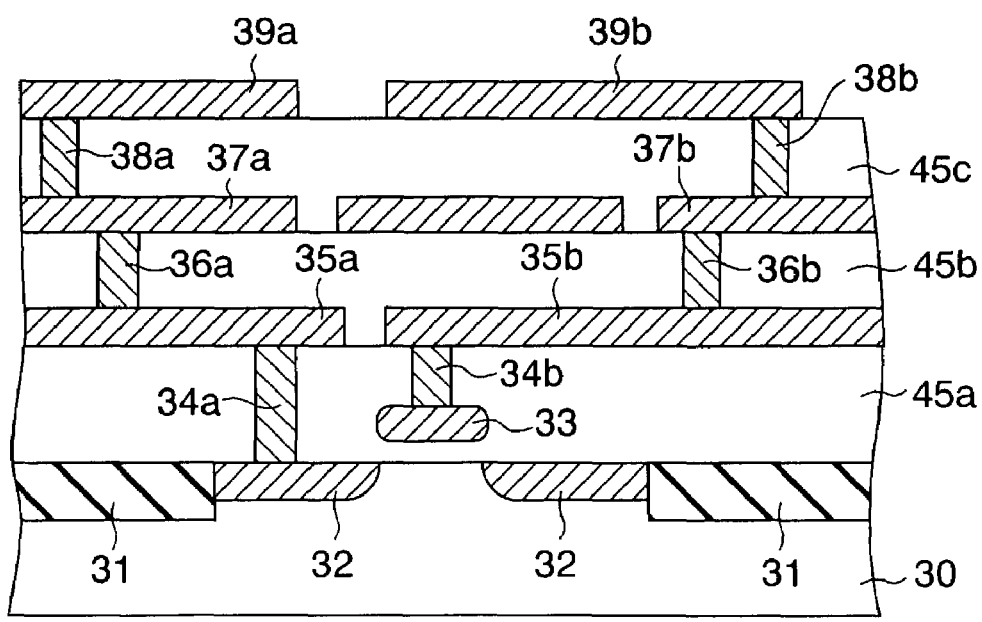

Using the resist film 47 as a mask, dry etching employing $Cl_2/BCl_3/N_2$ type of gas is performed on the metallic film 46, thereby forming the lower electrode 39a and the wiring 39b of the third wiring layer 39 and the like as shown in FIG. 4C. The resist film 47 is then removed as shown in FIG. 4D.

Figure 4E:
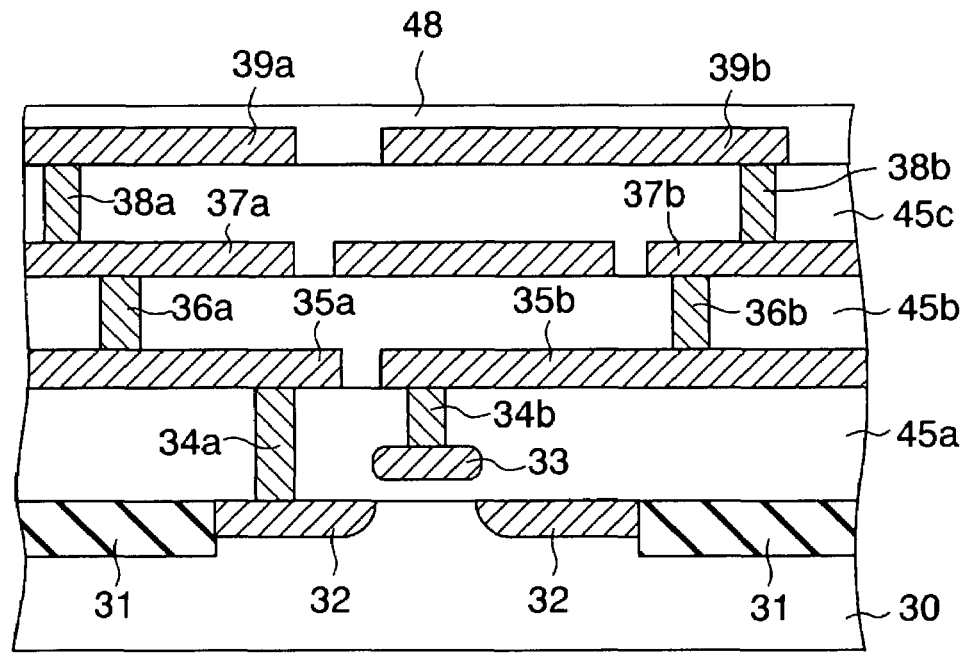
Figure 4F:
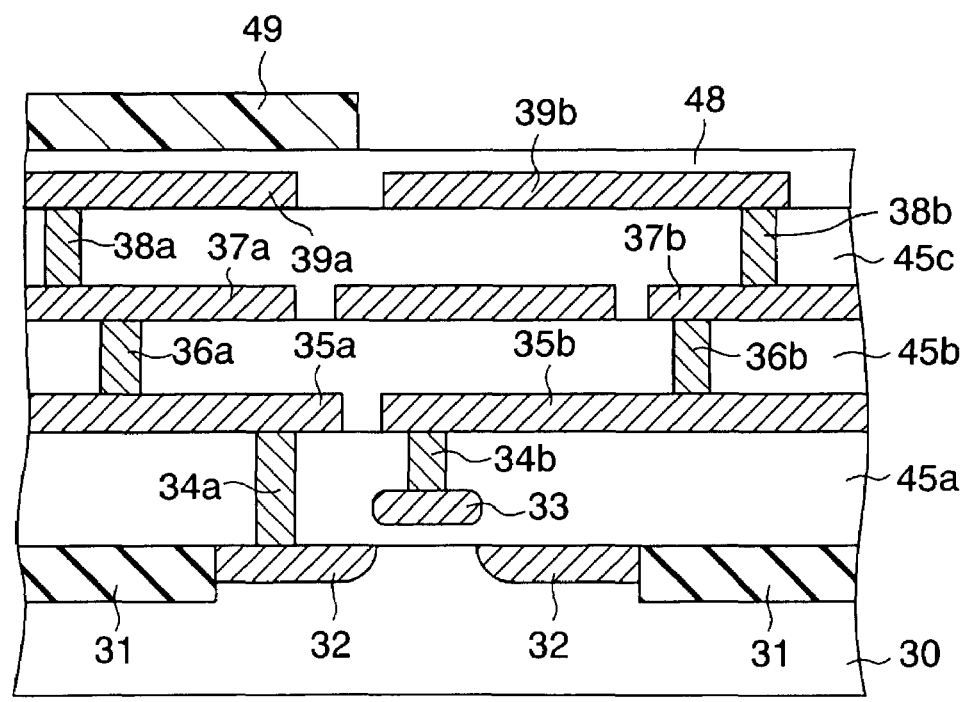

As shown in FIG. 4E, a silicon oxide film 48 is next formed on the entire surface of the semiconductor substrate 30 to a thickness of about 30 nm by means of a plasma CVD method. Then a resist film 49, as shown in FIG. 4F, is formed on the silicon oxide film 48 with a predetermined pattern. It is essential that the resist film 49 is formed slightly larger than the lower electrode 39a so as to leave a portion of the silicon oxide film 48, that is, the portion on the side of the lower electrode 39a.

Figure 4G:
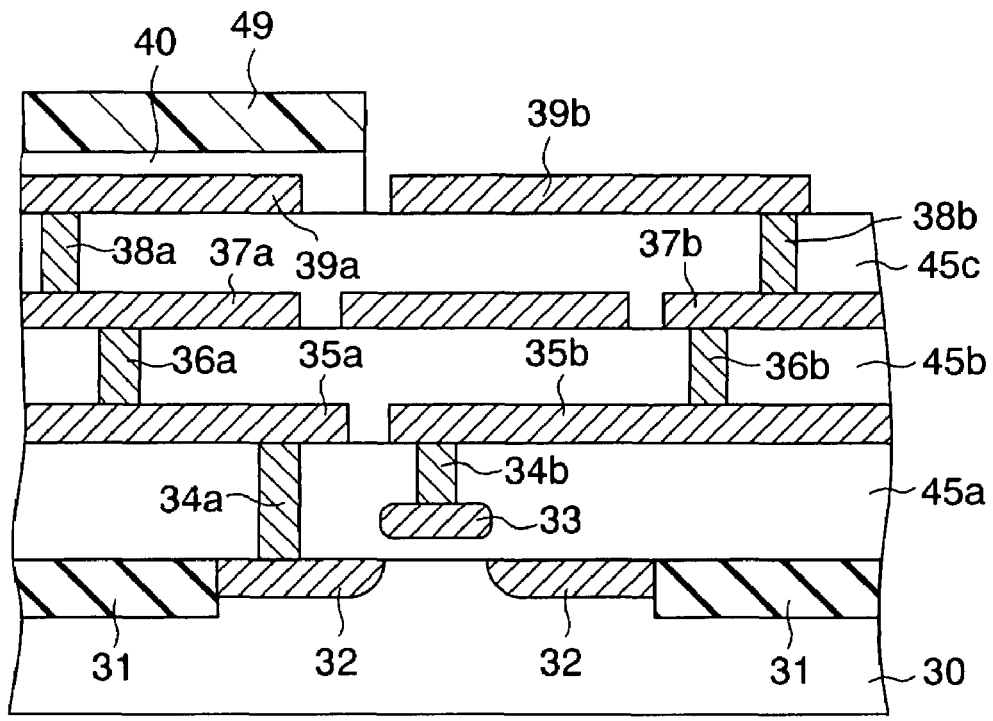
Figure 4H:
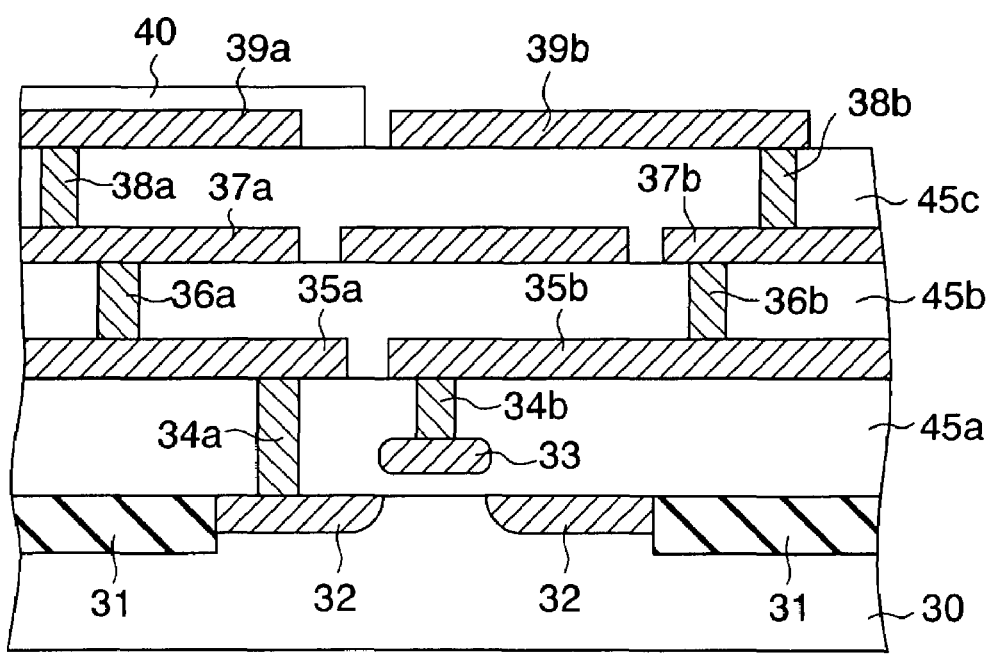

With the resist film 49 as a mask, the silicon oxide film 48 is etched away as shown in FIG. 4G, consequently forming the capacitance insulating film 40 covering the top and the side of the lower electrode 39a. The resist film 49 is then removed as shown in FIG. 4H.

Figure 4I:
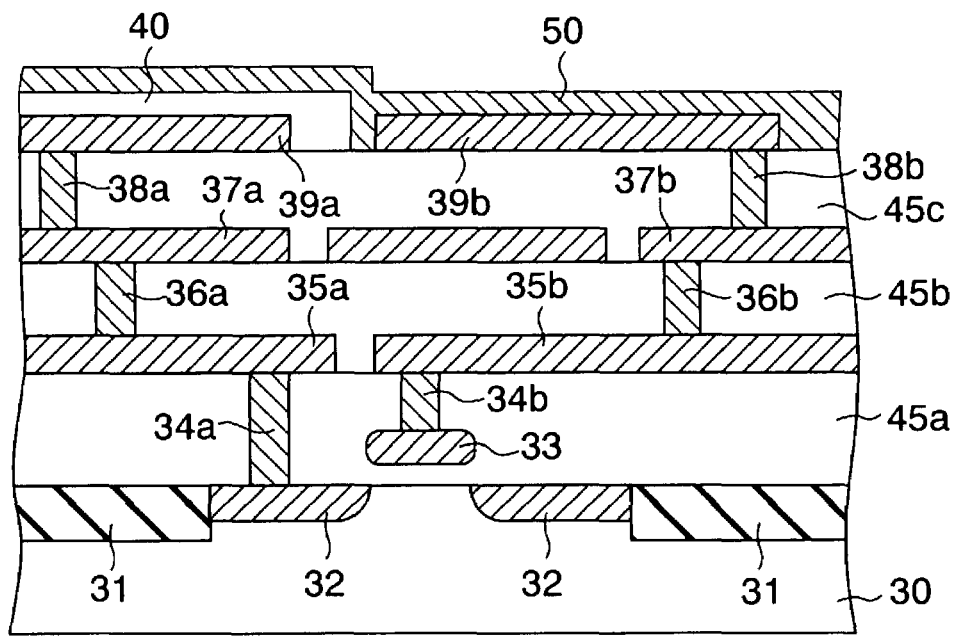
Figure 4J:
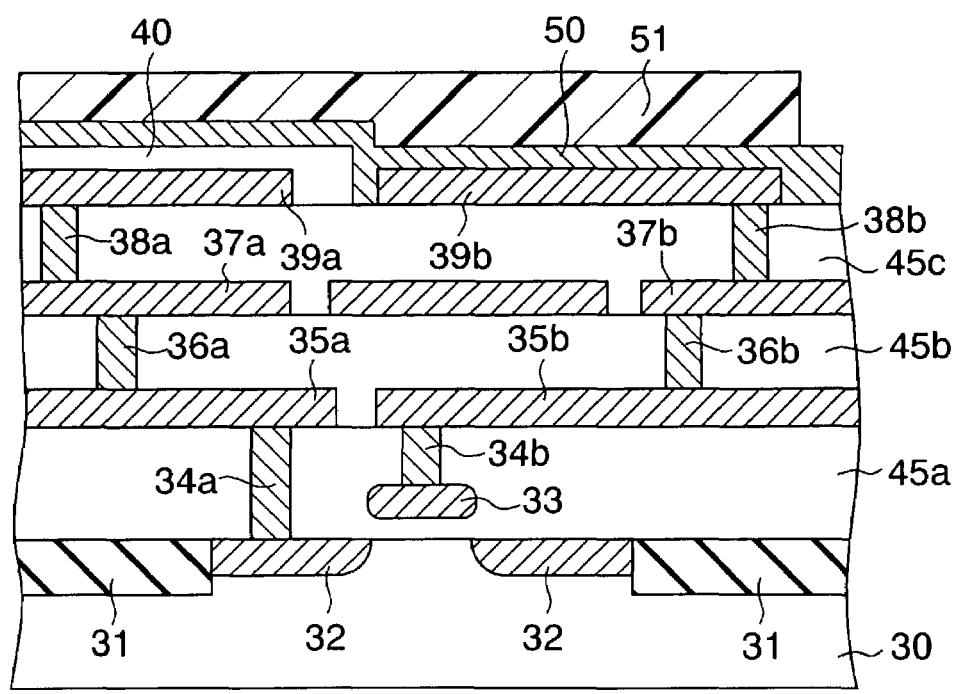

As shown in FIG. 4I, a TiN film 50 is next formed on the entire surface of the semiconductor substrate 30 to a thickness of about 150 nm by means of a sputtering method. Then a predetermined resist film 51 is formed having a desired wiring pattern and an upper electrode pattern on the TiN film 50 as shown in FIG. 4J.

Figure 4K:
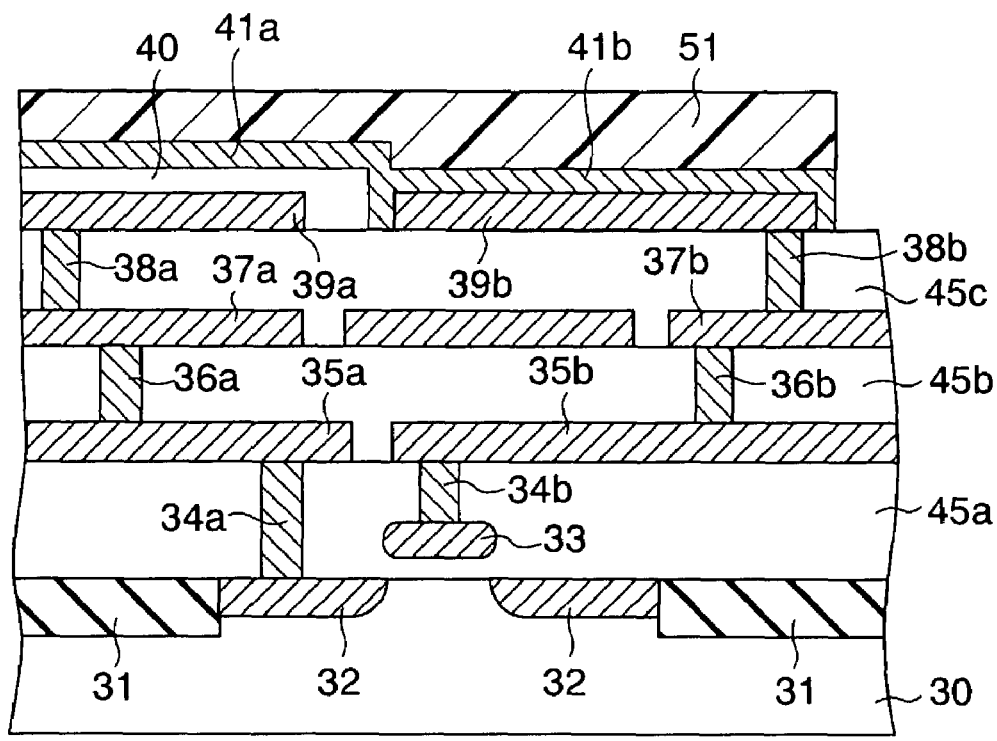
Figure 4L:
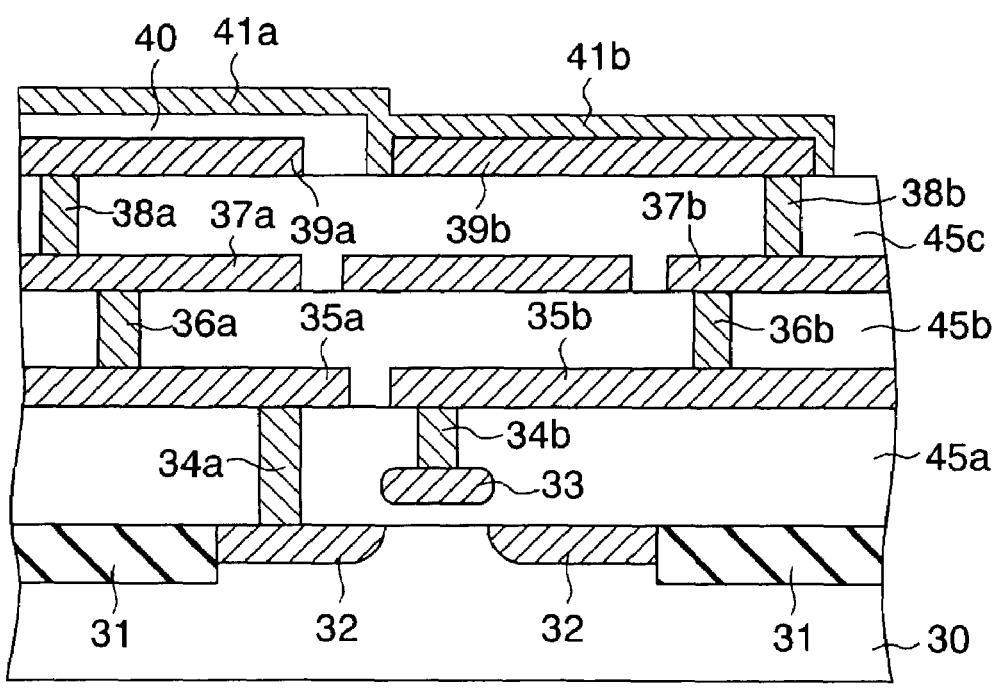

The TiN film 50 is etched away using the resist film 51 as a mask, thereby forming the upper electrode 41a of the capacitor element 44, the lead wiring 41b for electrically connecting the upper electrode 41a to the wiring 39b, and the other wiring of the third wiring layer 39 as shown in FIG. 4K. Thereafter, the resist film 51 is removed as shown in FIG. 4L.

Figure 4M:
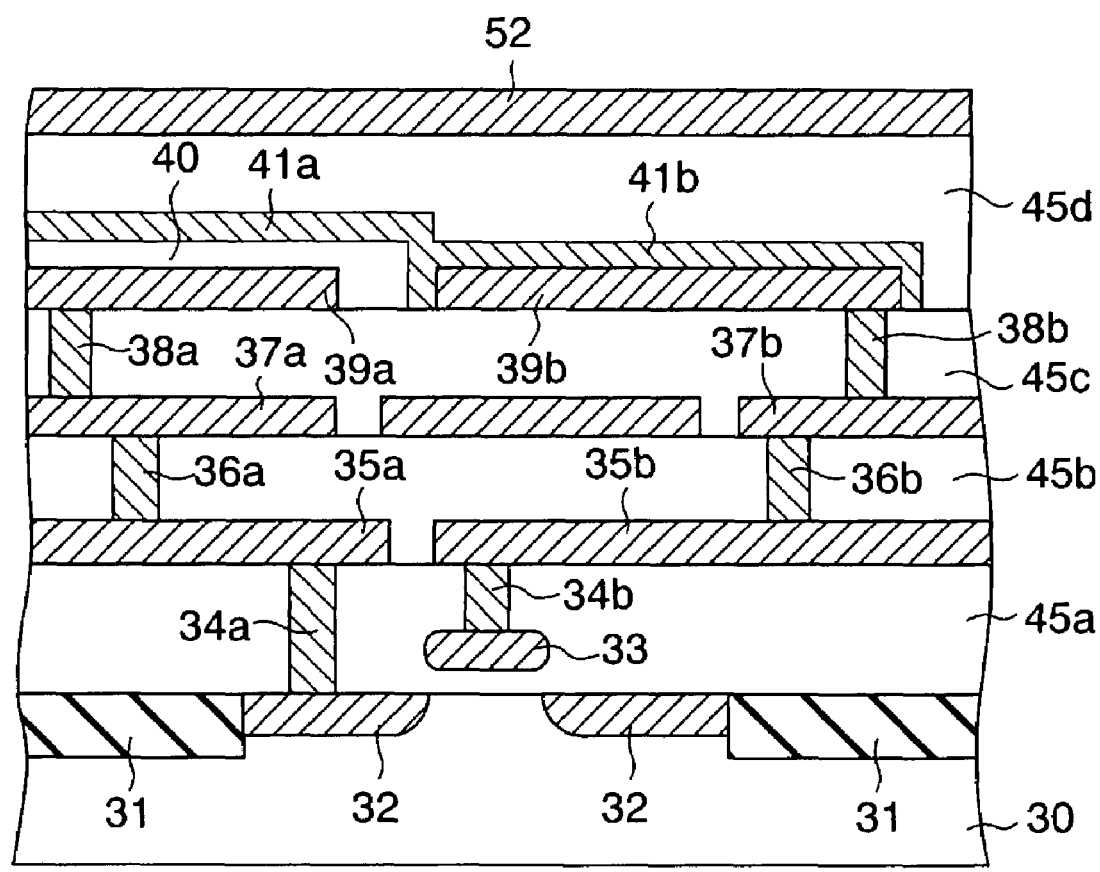

Subsequently, as shown in FIG. 4M, the interlayer insulating film 45d is formed on the entire surface of the semiconductor substrate 30 by means of the CVD method, and then a contact hole is formed at a predetermined location of the interlayer insulating film 45d. Al/Cu is then deposited on the entire top surface of the semiconductor substrate 30 by means of the sputtering method, thus forming a via (not shown) to be connected to the wiring of the third wiring layer 39 and a metallic film (Al/Cu film) 52 to a thickness of about 500 nm on the interlayer insulating film 45d as well. As shown in FIG. 3, upon patterning the metallic film 52 by photolithography method, the shield 43a and a wiring (not shown) of the fourth wiring layer 43 are formed. The semiconductor device comprising the MIM capacitor element according to the present embodiment is thus completed.

According to the method of manufacturing the semiconductor device comprising the MIM capacitor element of the present embodiment, there is no wiring in the fourth wiring layer (uppermost layer) 43 directly connected to the MIM capacitor element 44, and since the upper portion of the capacitor element 44 is covered by the shield 43a, the generation of parasitic capacitance between the electrode 41a of the capacitor element 44 and the conductor outside the package can be avoided. As a result, the effect of preventing external noises from mixing into the semiconductor device is attained when employed in the analog circuit.

(Second Embodiment)

Figure 5:
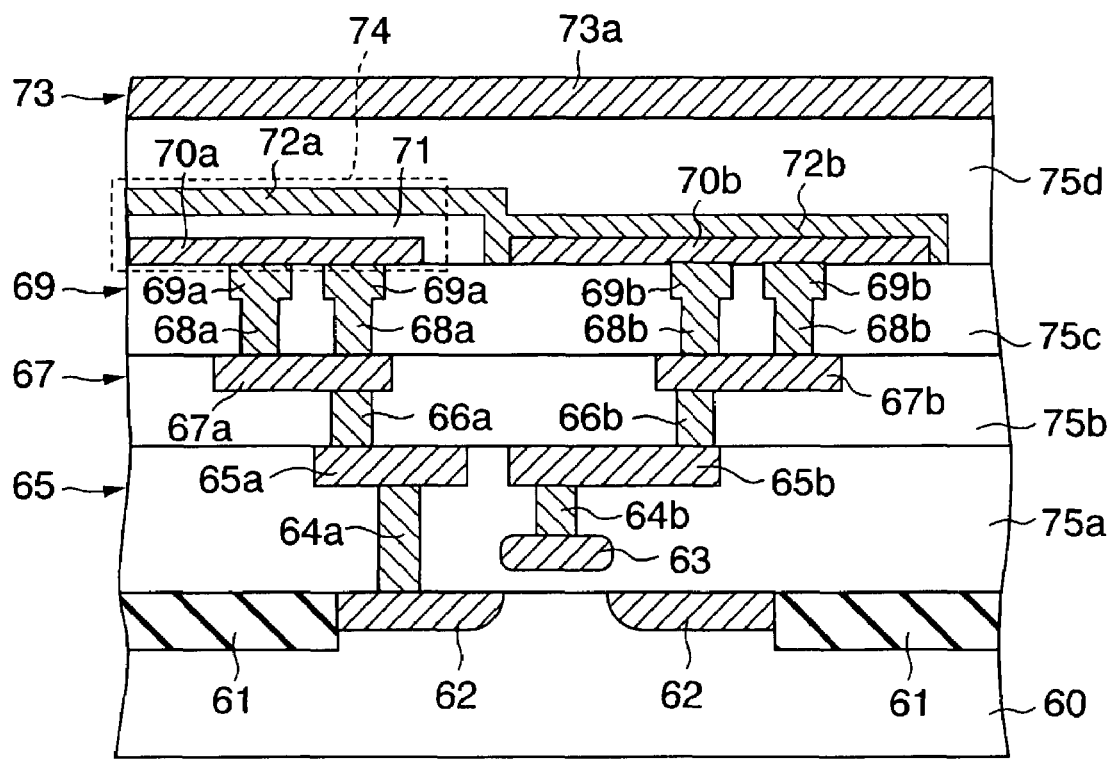
FIG. 5 is a sectional view showing a semiconductor device comprising a MIM capacitor element of a second embodiment of the present invention.

FIG. 5 is a sectional view showing a semiconductor device comprising a MIM capacitor element according to a second embodiment of the present invention.

In recent years, with the advancement the level of integration of semiconductor devices, copper (Cu) is being used as a wiring material in place of aluminum or aluminum alloy (hereinafter simply referred to as "Al"), which have been generally used in prior arts. Compared to Al, the merits of copper are that it shows low electric resistance and high electromigration tolerance.

A copper wiring is usually formed by a method called the damascene method. According to the damascene method, trench is formed in an insulating film by a desired wiring pattern, and thereafter copper is embedded within the trench. The copper adhered on the insulating film is removed by means of Chemical Mechanical Polishing (CMP), thereby forming a copper wiring.

However, there is a disposition in the CMP of copper, wherein when there is a copper pattern having a large area and a copper pattern having a small area, then the speed of polishing the large pattern thereof is fast while the speed of polishing the small area thereof is slow. Because of this, there is a problem in that the copper pattern of a capacitance portion will be overly polished during the process of CMP if a pattern requiring a large area like an electrode of a capacitor element is formed of copper. In order to prevent such problem, it is necessary to form the electrode of the capacitor element in a different process from that of the copper wiring. The present invention is an example of applying the present invention to these semiconductor devices.

An element isolation region 61 which partitions a semiconductor substrate 60 into a plurality of element regions is provided in the semiconductor substrate 60. In each of the element regions partitioned by the element isolation region 61, a pair of impurity diffusion regions 62 that are source/drain of a MOS transistor are formed in a state where they are separated from each other. A gate 63 is formed above a region between the pair of impurity diffusion regions 62 so as to interpose an insulating film (gate insulating film) therebetween.

Four wiring layers are provided above the semiconductor substrate 60. Herein, the four wiring layers indicate a first wiring layer (lowermost layer) 65, a second wiring layer 67, a third wiring layer 69, and a fourth wiring layer (uppermost layer) 73, respectively, in the order of closeness to the semiconductor substrate 60. The first wiring layer 65, the second wiring layer 67, and the third wiring layer 69 are formed of Cu, and the fourth wiring layer 73 is formed of Al. A predetermined pattern wiring is formed in each of the wiring layers 65, 67, 69, and 73.

Note that in the formation of the copper wirings of the wiring layers 65, 67, and 69, the width thereof is formed so that it is narrower than a fixed width determined by manufacturing restrictions. When there is a need to flow a large electric current, a plurality of wirings having a narrower width than the fixed width are arranged parallelly, whereby elements are connected by these wirings.

Interlayer insulating films 75a, 75b, 75c, and 75d are formed between the semiconductor substrate 60 and the first wiring layer 65, the first wiring layer 65 and the second wiring layer 67, the second wiring layer 67 and the third wiring layer 69, and the third wiring layer 69 and the fourth wiring layer 73, respectively.

In the present embodiment, one of the impurity diffusion regions 62 of the MOS transistor is connected to a wiring 65a of the first wiring layer 65 via a via 64a, and the gate 63 thereof is connected to a wiring 65b of the first wiring layer 65 via a via 64b. Further, the wiring 65a is connected to a wiring 67a of the second wiring layer 67 via a via 66a, and the wiring 65b is connected to a wiring 67b of the second wiring layer 67 via a via 66b. Still further, the wiring 67a is connected to a wiring 69a of the third wiring layer 69 via a via 68a, and the wiring 67b is connected to a wiring 69b of the third wiring layer 69 via a via 68b.

A lower electrode 70a of a capacitor element 74 is formed on the wiring 69a of the third wiring layer 69, and a capacitance insulating film 71 and an upper electrode 72a are formed on the lower electrode 70a. The upper electrode 72a is electrically connected to the wiring 69b of the third wiring layer 69 via lead wiring 70b and 72b.

In the fourth wiring layer 73, a shield 73a is formed covering the upper portion of the capacitor element 74. A passivation film (not shown) is formed on the fourth wiring layer 73. Further, the semiconductor substrate 60, in which these wiring layers 65, 67, 69, and 73 and the passivation film are formed, is sealed in a package (not shown) made of resin or the like.

In this embodiment, the upper electrode 72a of the capacitor element 74 is connected to the wiring 69b of the third wiring layer 69 without having to go through the fourth wiring layer (uppermost layer) 73, and is thus connected to the MOS transistor via the wiring 69b. Further, in the fourth wiring layer 73, the shield 73a is formed so as to cover the upper portion of the capacitor element 74. Therefore, the shield 73a is retained at a fixed voltage, whereby the generation of parasitic capacitance between the capacitor element 74 and a conductor outside the package is avoided. Accordingly, precision of the analog circuit can be sufficiently secured.

FIGS. 6A to 6M are sectional views showing the process sequence of the manufacturing method of a semiconductor device comprising the MIM capacitor element according to the present invention.

Figure 6A:
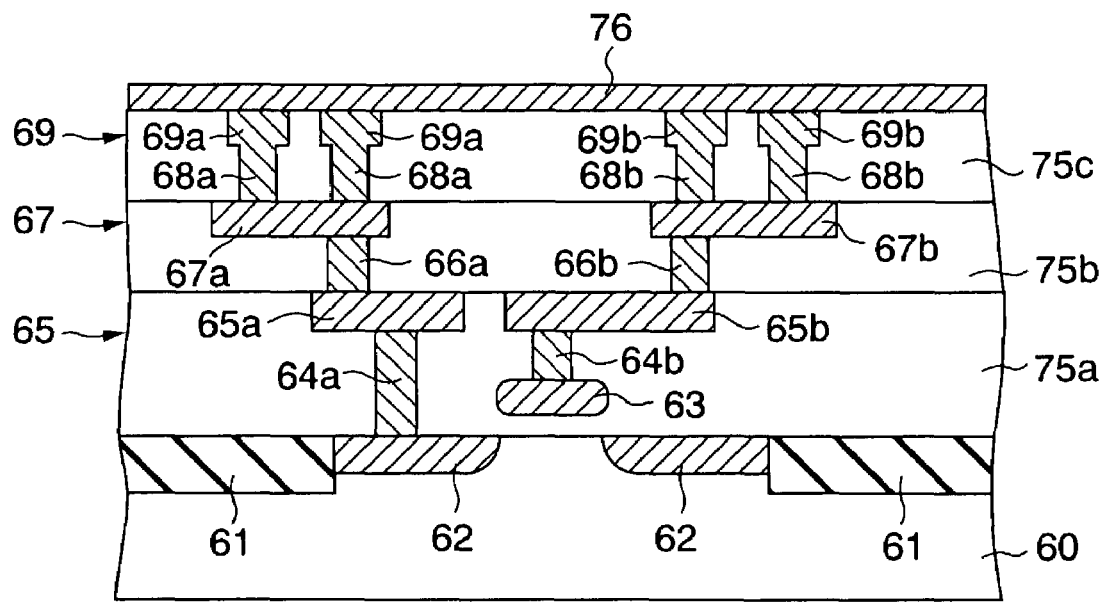
FIGS. 6A to 6M are sectional views showing a method of manufacturing the semiconductor device comprising the MIM capacitor element of the second embodiment of the present invention.

First, as shown in FIG. 6A, an element isolation region 61 is formed in the semiconductor substrate 60 by means of the STI method. An insulating film (gate insulating film) is next formed on the semiconductor substrate 60 to thereby form a predetermined pattern gate 63, which is made of polysilicon, on the insulating film. After injecting an impurity into the semiconductor substrate 60 with the gate 63 as a mask, heat treatment is performed to thereby form the impurity diffusion regions 62. Silicon oxide is then deposited on the entire surface of the semiconductor substrate 60, thereby forming the interlayer insulating film 75a.

Thereafter, a contact hole and a trench are formed at a predetermined location of the interlayer insulating film 75a by means of the photolithography method. A tantalum (Ta) film is formed to a thickness of about 25 nm on the entire surface of the interlayer insulating film 75a to serve as a barrier metal film, and Cu is sputtered so as to successively form a seed layer thereon. Then, Cu is plated by means of a plating method, thereby forming an approximately 950 nm Cu film. The barrier metal film and the Cu film formed on the interlayer insulating film 75a are removed by means of the CMP method, so as to leave the Cu only within the contact hole and the trench, thus forming the vias 64a and 64b, and wirings 65a, and 65b of the first wiring layer 65, etc.

Silicon oxide is then deposited on entire surface of the semiconductor substrate 60 to thereby form the interlayer insulating film 75b, and then by means of the photolithography method, a contact hole and a trench are formed at a predetermined location of the interlayer insulating film 75b. After successively forming the barrier metal film and the seed layer on the entire surface of the interlayer insulating film 75b, a Cu film is formed thereon to a thickness of approximately 950 nm. The barrier metal film and the Cu film formed on the interlayer insulating film 75b are removed by means of the CMP method, so as to leave the Cu only within the contact hole and the trench, thus forming the vias 66a and 66b and wirings 67a and 67b of the second wiring layer 67.

The processes of forming the interlayer insulating film 75c, vias 68a and 68b, the wirings 69a and 69b of the third wiring layer 69 or the like are the same thereinafter.

Next, a TiN film 76 is formed to a thickness of about 100 nm on the entire surface of the semiconductor substrate 60 by means of sputtering method.

Figure 6B:
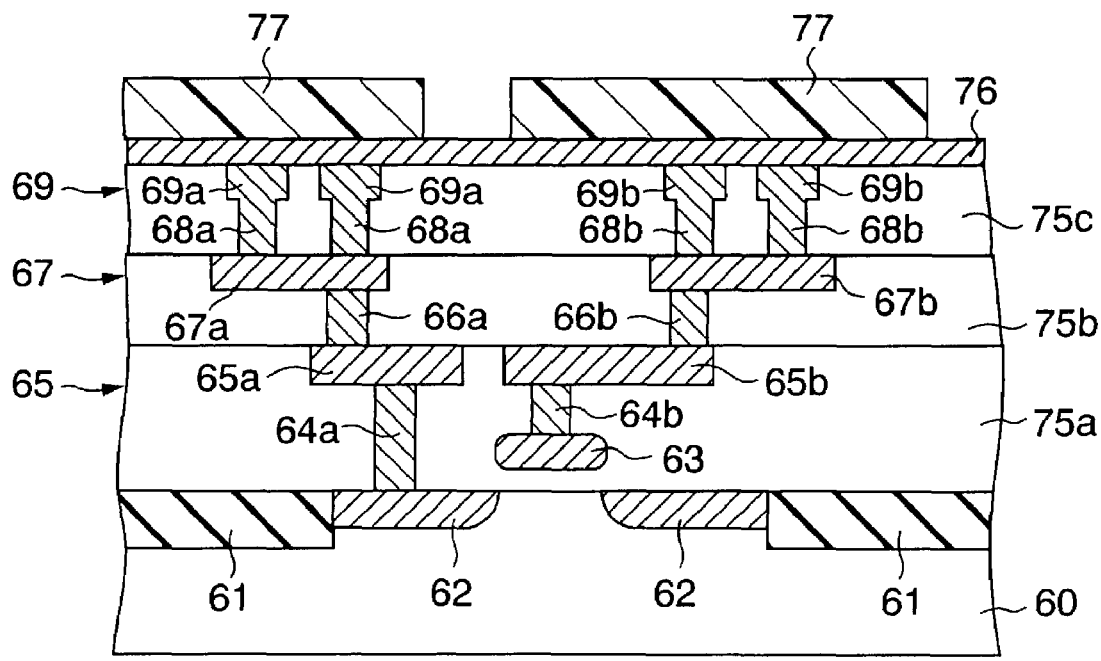

As shown in FIG. 6B, a predetermined patterned resist film 77 is next formed on the TiN film 76 by photoresist.

Figure 6C:
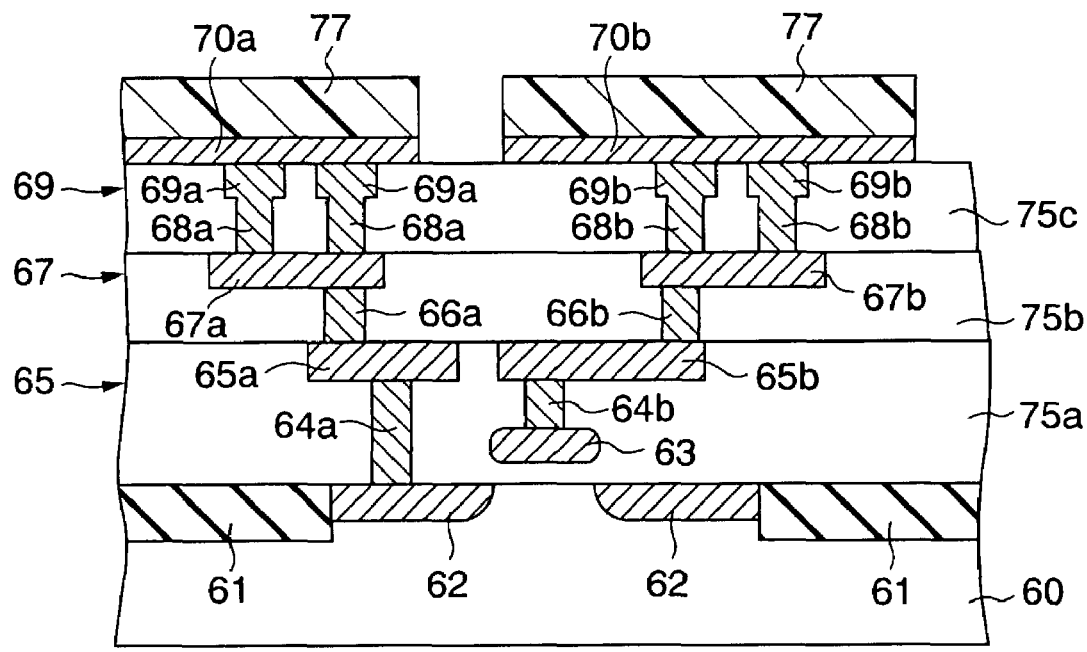
Figure 6D:
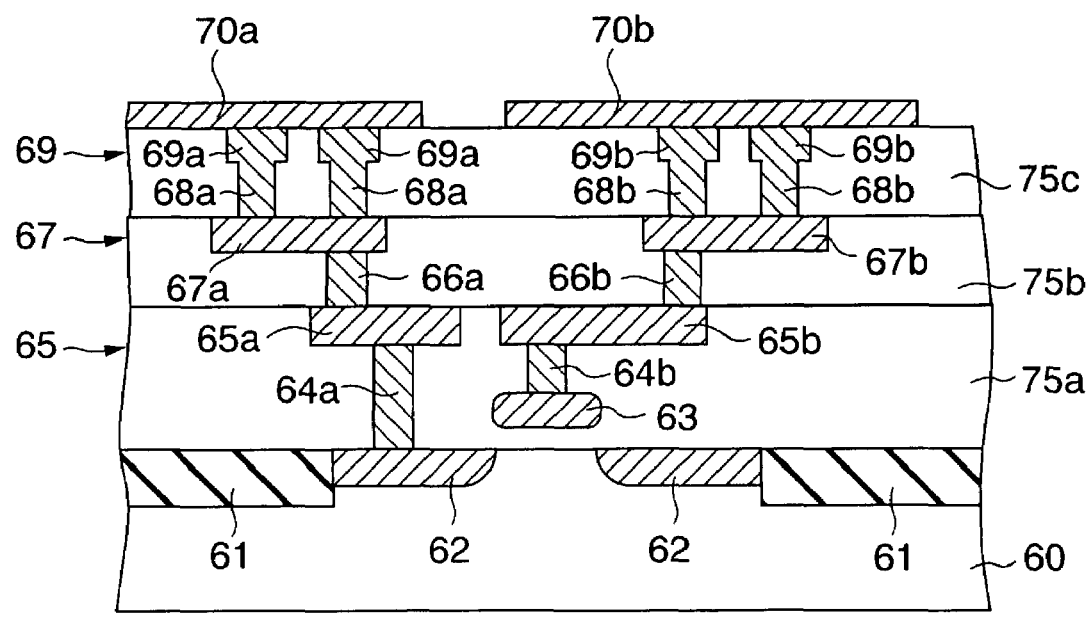

Then, with the resist film 77 as a mask, anisotropic etching is performed on the TiN film 76 by using $CF_4/O_2/H_2O$ type gas, thereby forming the lower electrode 70a and the first lead wiring 70b as shown in FIG. 6C. In this example, the lower electrode 70a is formed on the wiring 69a of the third wiring layer 69, and the first lead wiring 70b is formed on the wiring 69b of the third wiring layer 69. Thereafter, the resist film 77 is removed as shown in FIG. 6D.

Figure 6E:
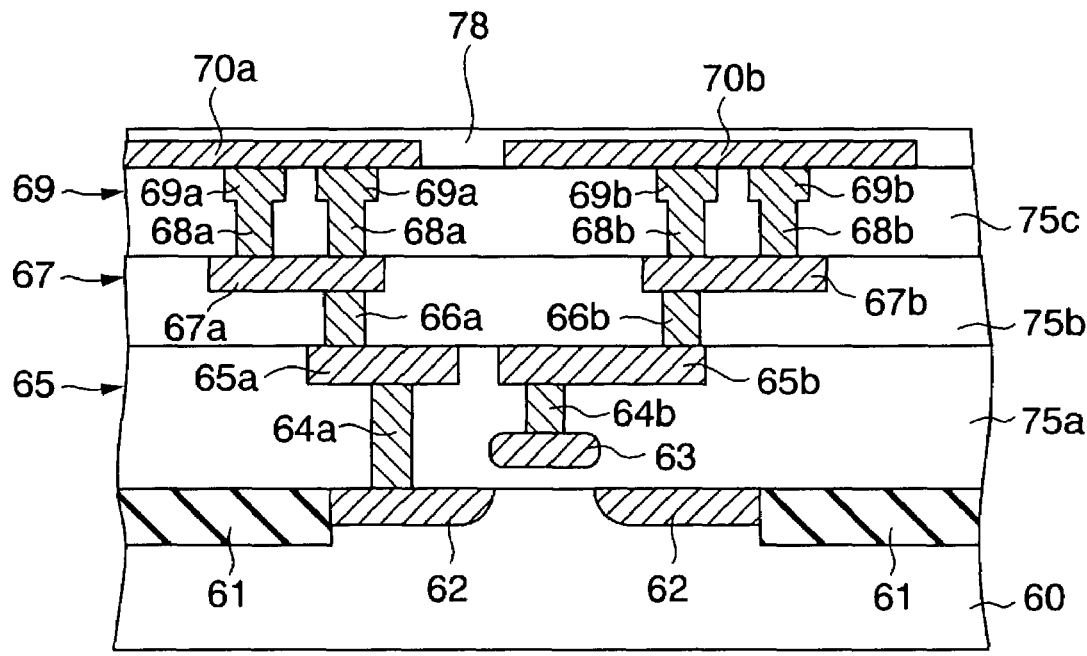
Figure 6F:
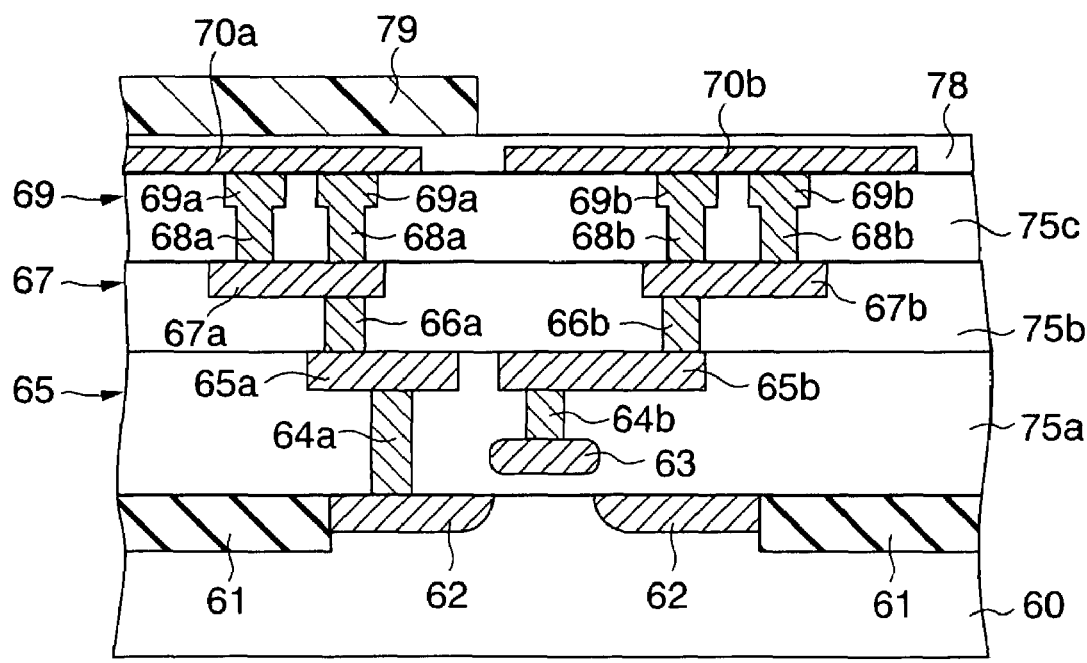

As shown in FIG. 6E, a silicon oxide film 78 is next formed on the entire surface of the semiconductor substrate 60 to a thickness of about 30 nm by means of plasma CVD method. Then a resist film 79, as shown in FIG. 6F, is formed on the silicon oxide film 78. The resist film 79 is formed slightly larger than the lower electrode 70a so as to leave a portion of the silicon oxide film 78 on the side of the lower electrode 70a.

Figure 6G:
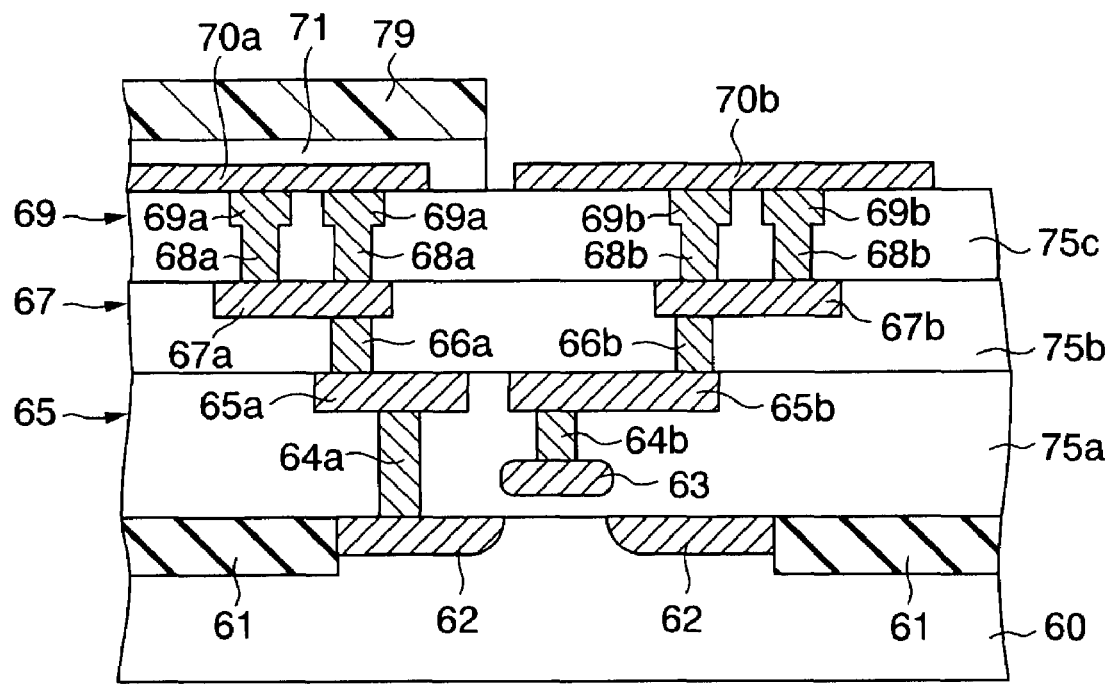
Figure 6H:
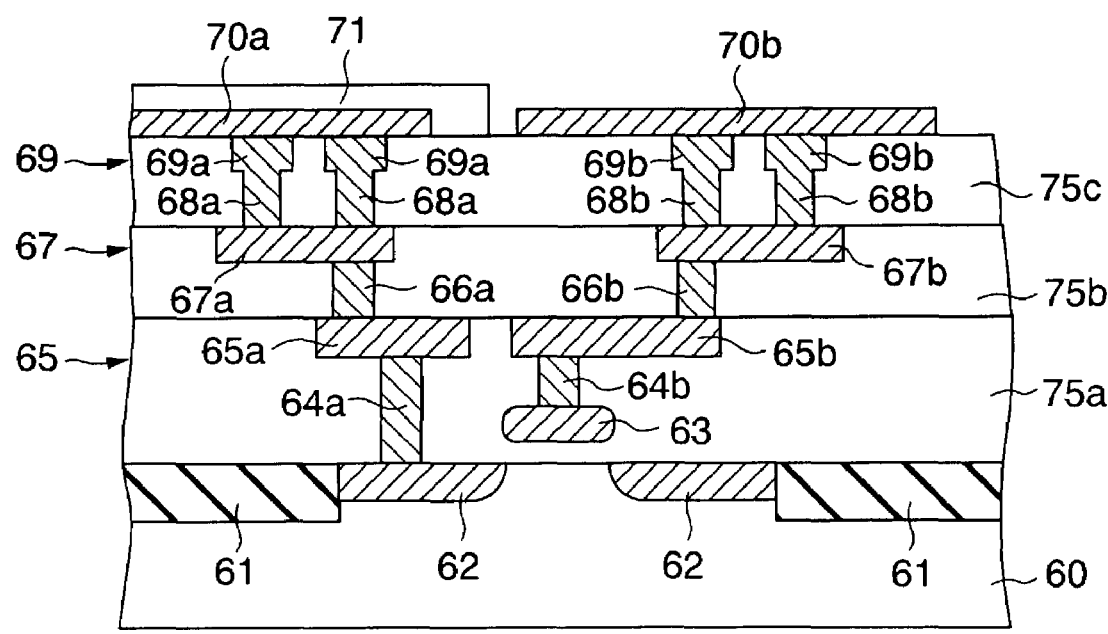

With the resist film 79 as a mask, the silicon oxide film 78 is etched away as shown in FIG. 6G, consequently forming the capacitance insulating film 71 covering the top and the side of the lower electrode 70a. The resist film 79 is then removed as shown in FIG. 6H.

Figure 6I:
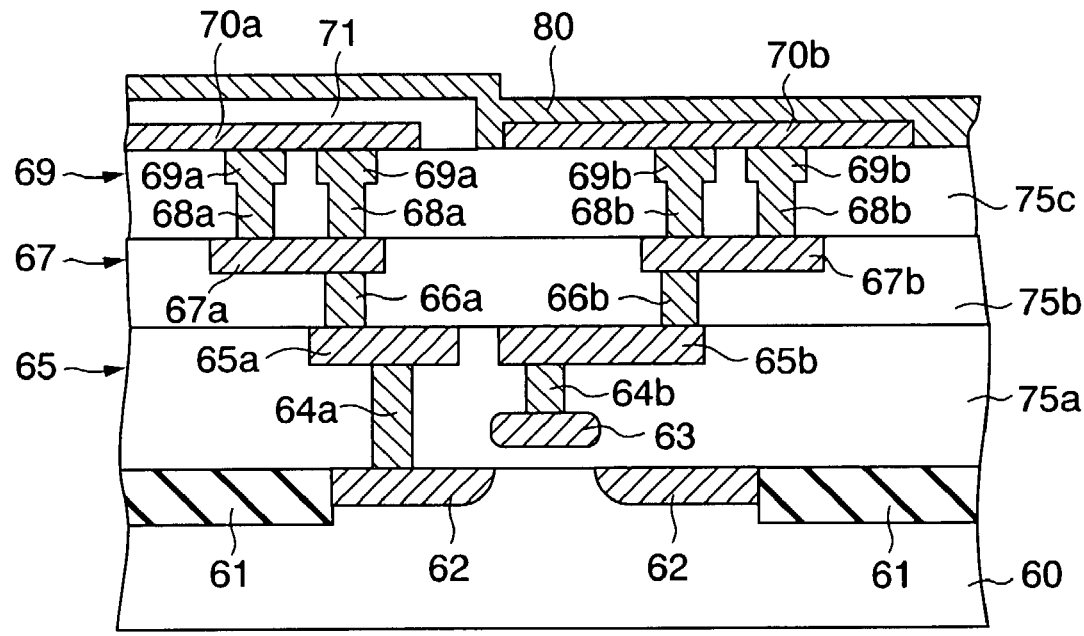
Figure 6J:
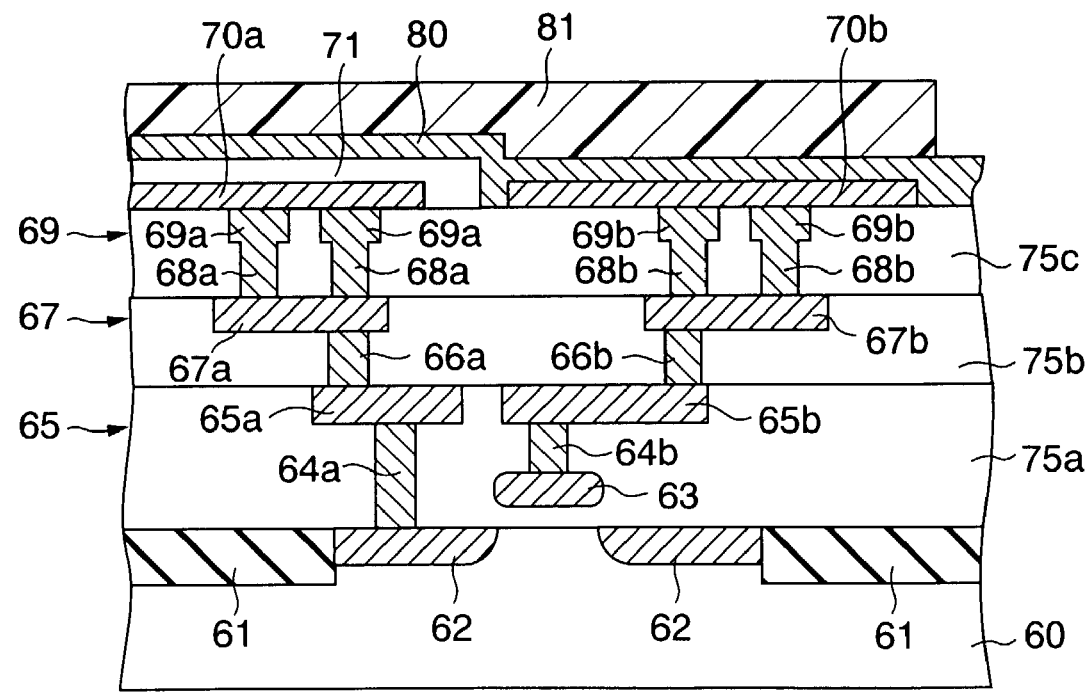

Subsequently, as shown in FIG. 6I, a TiN film 80 is formed on the entire surface of the semiconductor substrate 60 to a thickness of about 100 nm by means of a sputtering method. Then a predetermined resist film 81 is formed having a desired upper electrode pattern and a lead wiring pattern on the TiN film 80 as shown in FIG. 6J.

Figure 6K:
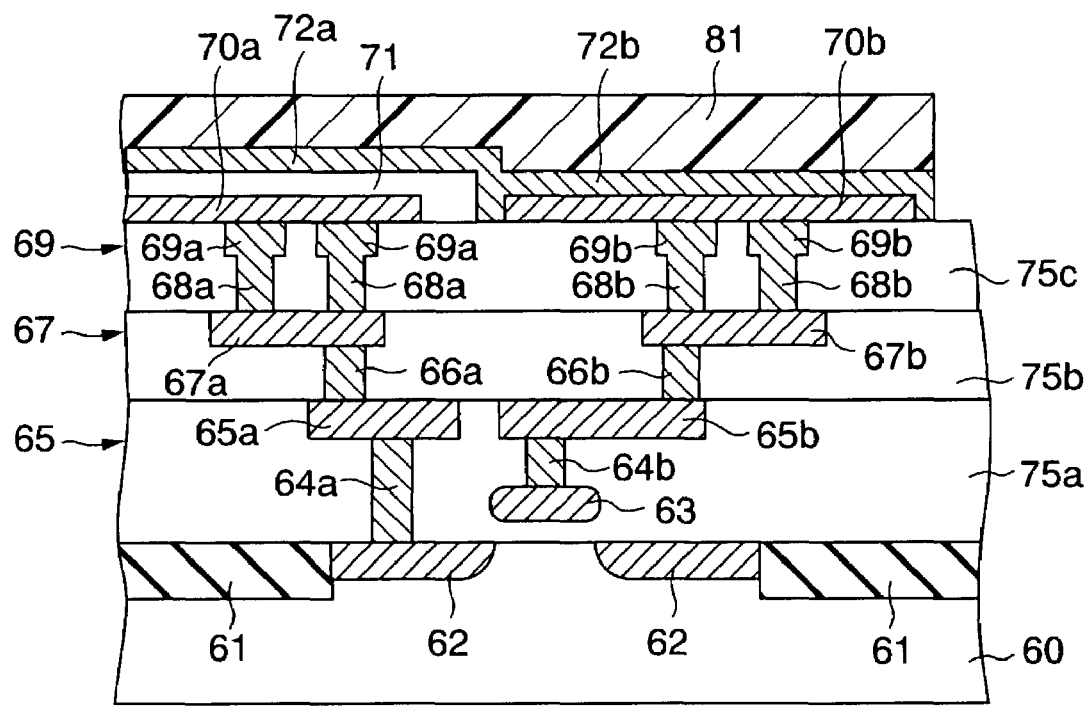
Figure 6L:
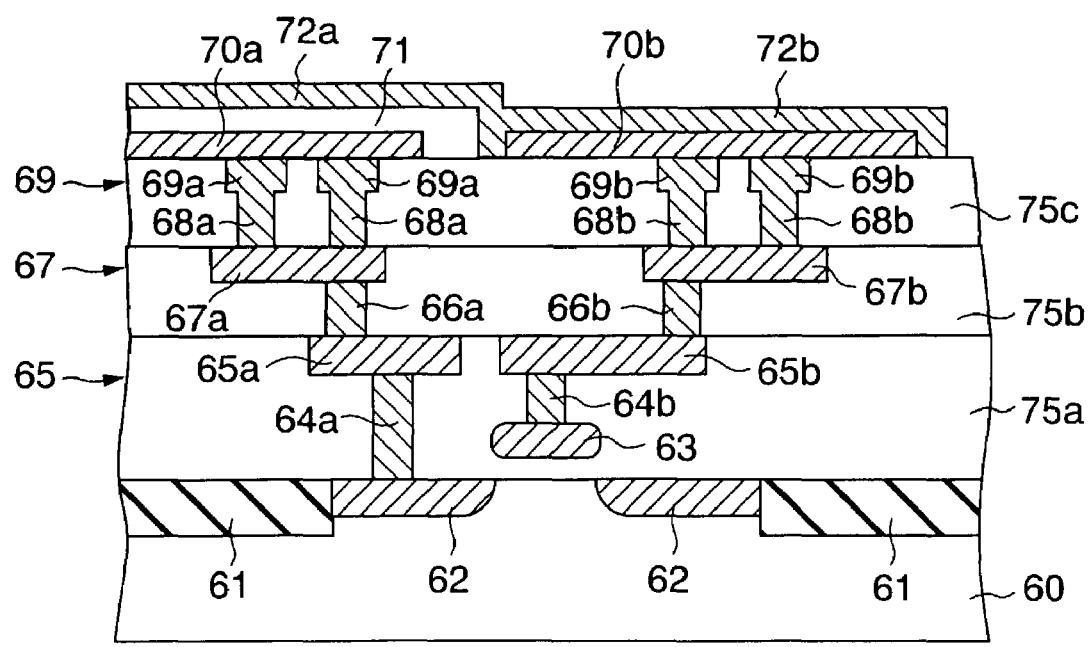

The TiN film 80 is etched away using the resist film 81 as a mask, thereby forming the upper electrode 72a of the capacitor element 74 and the second lead wiring 72b to be connected to the first lead wiring 70b as shown in FIG. 6K. Thereafter, the resist film 81 is removed as shown in FIG. 6L.

Figure 6M:
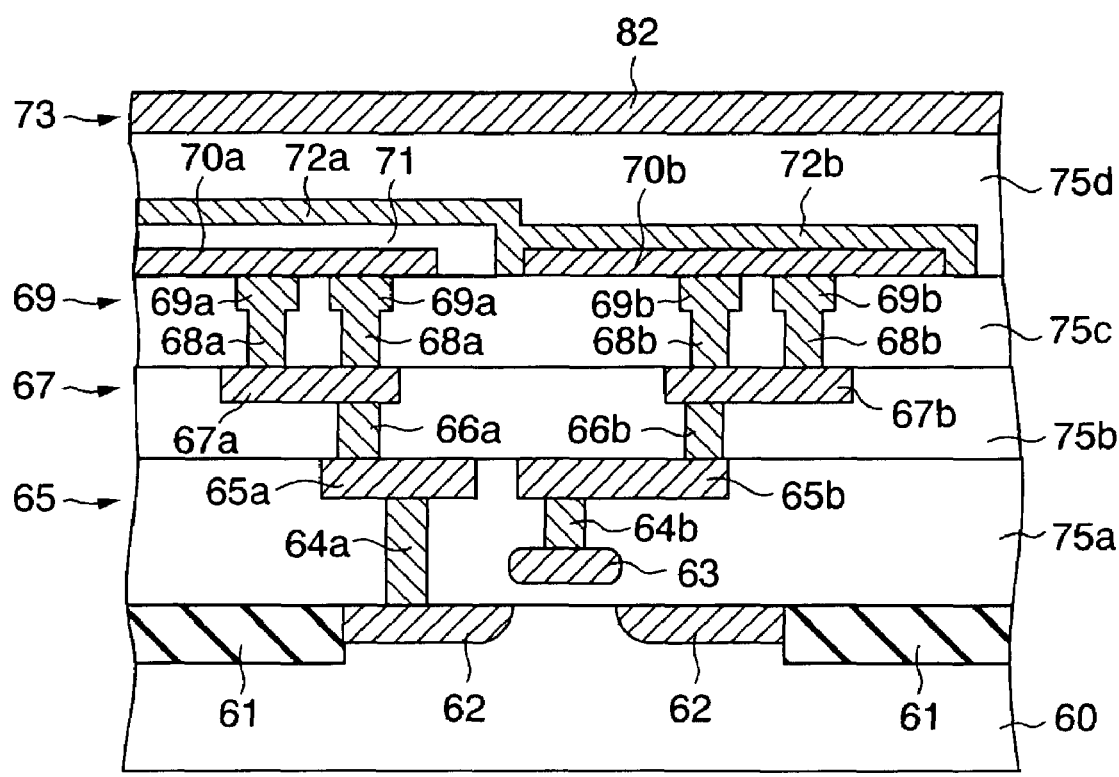

Subsequently, as shown in FIG. 6M, the interlayer insulating film 75d is formed on the entire surface of the semiconductor substrate 60, and then a contact hole is formed in a predetermined location of the interlayer insulating film 75d. Together with the formation of a via (not shown) to be connected to the wiring of the third wiring layer 69, an Al film 82 formed to a thickness of about 500 nm is formed on the interlayer insulating film 75d as well, after which Al has been deposited on the entire surface of the semiconductor substrate 60 by means of the CVD method. As shown in FIG. 5, upon patterning the Al film 82 by means of photolithography method, the shield 73a and a wiring (not shown) of the fourth wiring layer 73 are formed. The semiconductor device comprising the capacitor element according to the present embodiment is thus completed.

According to the method of manufacturing the semiconductor device comprising the capacitor element of the present embodiment, there is no wiring in the fourth wiring layer (uppermost layer) 73 that is directly connected to the MIM capacitor element 74, and since the upper portion of the capacitor element 74 is covered by the shield 73a, the generation of parasitic capacitance between the electrode 72a of the capacitor element 74 and the conductor outside the package can be avoided. As a result, the effect of preventing external noises from mixing into the semiconductor device is attained when employed in the analog circuit.

Note that while the case of four layers of wiring was described in the first and second embodiments described above, the present invention is applicable to the case of three layers of wiring and even to the case of more than five layers.

What is claimed is:

1. A semiconductor device comprising:
a semiconductor substrate;
Nth number of metallic wiring layers (provided that N is an integer equal to or greater than 3) laminated respectively via an insulating film above the upper portion of said semiconductor substrate;
a capacitor element composed of a lower electrode, a capacitance insulating film, and an upper electrode formed above said semiconductor substrate, wherein the lower electrode of said capacitor element is formed in an (Nth−1) wiring layer which is immediately under the uppermost wiring layer, said capacitance insulating film and said upper electrode are formed between said (Nth−1) wiring layer and said Nth wiring layer, and said upper electrode is formed via the insulating film under the uppermost wiring layer, and said upper electrode is in electrical connection with a wiring of said (Nth−1) wiring layer without said Nth wiring layer interposed therebetween; and
a shield fully covering the upper portion of said capacitor element and the shield is formed in said Nth wiring layer which is an uppermost layer, and not electrically connected to the upper electrode and the lower electrode of the capacitor,
wherein a wiring which is electrically connected to the upper electrode and the lower electrode of the capacitor does not exist above the capacitor, and
wherein said shield is retained at a fixed voltage that is greater than zero.

2. A semiconductor device according to claim 1, wherein a wiring connecting said wiring of said (Nth−1) wiring layer to said upper electrode is formed from the same metallic film as said upper electrode.

3. A semiconductor device comprising:
a semiconductor substrate;
Nth number (provided that N is an integer equal to or greater than 3) of metallic wiring layers laminated respectively via an insulating film above said semiconductor substrate;
a capacitor element composed of a lower electrode, a capacitance insulating film, and an upper electrode, the capacitor element which is formed between an uppermost wiring layer (Nth wiring layer) thereof and an (Nth−1) wiring layer which is immediately under the uppermost wiring layer among said metallic wiring layers, and the upper electrode and the lower electrode formed as different layer from the Nth wiring layer and Nth−1 wiring layer, wherein
said lower electrode is formed on a wiring of said (Nth−1) wiring layer,
said capacitance insulating film is formed on top of said lower electrode,
said upper electrode is formed on top of said capacitance insulating film, and
said upper electrode is in electrical connection with a wiring of said (Nth−1) wiring layer without said Nth wiring layer interposed therebetween; and
a shield fully covering the upper portion of said capacitor element formed in said Nth wiring layer which is an uppermost layer, and not electrically connected to the upper electrode and the lower electrode of the capacitor,
wherein a wiring which is electrically connected to the upper electrode and the lower electrode of the capacitor does not exist above the capacitor, and
wherein said shield is retained at a fixed voltage that is greater than zero.

4. A semiconductor device according to claim 3, wherein among said wiring layers, at least said (Nth−1) wiring layer is formed of copper.

5. A semiconductor device according to claim 3, wherein a wiring that connects said wiring of said (Nth−1) wiring layer to said upper electrode is formed from a same metallic film as said upper electrode.

* * * * *